US 6,757,856 B2

(12) United States Patent
Bassett

(10) Patent No.: US 6,757,856 B2
(45) Date of Patent: Jun. 29, 2004

(54) APPARATUS AND METHOD FOR HARDWARE-ASSISTED DIAGNOSIS OF BROKEN LOGIC-TEST SHIFT-REGISTERS

(75) Inventor: Robert W. Bassett, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 349 days.

(21) Appl. No.: 09/681,955

(22) Filed: Jun. 29, 2001

(65) Prior Publication Data

US 2003/0005363 A1 Jan. 2, 2003

(51) Int. Cl.⁷ .............................................. G01R 31/28
(52) U.S. Cl. ...................................................... 714/729
(58) Field of Search ................................ 714/729, 726, 714/727, 728, 732, 724

(56) References Cited

U.S. PATENT DOCUMENTS

| | | | |
|---|---|---|---|
| 4,546,473 A | | 10/1985 | Eichelberger et al. |
| 4,630,270 A | | 12/1986 | Petit et al. |
| 4,817,093 A | | 3/1989 | Jacobs et al. |
| 4,894,830 A | * | 1/1990 | Kawai ........................ 714/731 |
| 5,386,423 A | | 1/1995 | Koo et al. |
| 5,504,756 A | * | 4/1996 | Kim et al. ................... 714/729 |
| 5,867,507 A | | 2/1999 | Beebe et al. |
| 6,026,505 A | | 2/2000 | Hedberg et al. |
| 6,191,603 B1 | * | 2/2001 | Muradali et al. ............ 324/765 |
| 6,199,183 B1 | * | 3/2001 | Nadaoka ...................... 714/726 |
| 6,567,943 B1 | * | 5/2003 | Barnhart et al. ............. 714/727 |

OTHER PUBLICATIONS

"Using Good Machine Characterization for Scan Diagnostics," IBM Technical Disclosure Bulletin, vol. 37, No. 07, pp. 439–441, Jul. 1994.
"Scan Path Reconfiguration For Improved Diagnostic Resolution In Multi–Chip Modules," IBM Technical Disclosure Bulletin, vol. 31, No. 4, pp. 484–486, Sep. 1988.
"Fault–Tolerant Serial–Shift Arrangement," IBM Technical Disclosure Bulletin, vol. 25, No. 9, pp. 4607–4622, Feb. 1983.

* cited by examiner

Primary Examiner—Christine T. Tu
(74) Attorney, Agent, or Firm—Scully, Scott, Murphy & Presser; Robert A. Walsh

(57) ABSTRACT

The present invention provides a systematic means of switching contiguous segments of each production-test shift-register into several diagnostic scan-configurations. If the functional scan-verification tests fail for the production-test scan-configuration, then these same verification tests can be repeated for the alternative, diagnostic scan configurations. Using the principle of superposition, the passing and failing LSSD flush/scan tests for these diagnostic configurations will allow the failing location to be localized to a single segment of the original failing shift-register.

16 Claims, 2 Drawing Sheets

APPARATUS AND METHOD FOR HARDWARE-ASSISTED DIAGNOSIS OF BROKEN LOGIC-TEST SHIFT-REGISTERS

BACKGROUND OF THE INVENTION

1. Field of the Invention

This invention generally relates to testing and diagnosing semiconductor devices, and more specifically, the invention relates to the testing and diagnosing of shift registers.

2. Prior Art

Structural testing and defect-diagnosis of semiconductor logic devices depend significantly on the minimum functionality of the underlying design-for-test structures embedded in the logical design of such devices. Scan-based methods of structural logic testing—of which Level-Sensitive Scan Design (LSSD) is but one example—configure all the state—elements (flip-flops or latches) into one or more serial shift-registers (often referred to as scan-chains or scan-strings) so that the values in these state-elements may be directly set or interrogated by operation of the shift-registers.

Conventional defect-diagnosis of failing logic tests normally proceeds on the assumption that the shift-registers have been determined to be a-priori functional (since the actual test-input stimulus being applied to the device during the failing tests cannot otherwise be assumed to be fully known). This functionality is assured by preceding the application of all such scan-based logic tests with functional-verification tests of the shift-registers. In LSSD, these are called the flush and scan tests. They verify the logical continuity of each serial-shift-register scan-path, and establish that each state-element in each shift-register can set and hold both logical-zero and logical-one values When either the flush or scan tests fail, the basic design-for-test infrastructure is broken—and none of the succeeding scan-based logic tests can be applied without expectation of massive fails, since the intended test stimulus/response will be corrupted by the broken shift-register(s). Moreover, localization and detailed diagnosis of a defect in a broken shift-register can be a very difficult problem, especially as the shift-register bit-length increases.

Broken-shift-register problems are most prevalent early in a technology-life-cycle, when device-yields tend to be the lowest, and when pressure for rapid yield-learning and volume ramp-up is the highest. The conventional approach (in microprocessor design) to managing this exposure has been to implement scan-design with as many separate shift-registers (64–80 or more) as the functional input/output (I/O) architecture of the device-design allows, thus permitting each shift-register to be of the shortest possible bit-length. Since microprocessors (and other standard products) typically utilize custom, device-specific test-fixturing, this high-pin-count approach to managing the risk of broken shift-registers has been an acceptable method.

In contrast, Application-Specific Integrated Circuit (ASIC) products have a long history of utilizing standardized, reusable test-fixturing to reduce overall test/fixturing costs across a large number of lower-volume device-designs sharing the same die configuration (chip image) and/or the same module package. This approach to multiple-device-design test standardization, often referred to as reduced-pin-count testing (RPCT), requires that each device-design implement an on-product boundary-scan structure to enable full scan-testing of all device-circuitry (except the I/O circuits) through a fixed-size signal-I/O interface comprising a maximum of 64 signal-I/Os contacted by full-function tester-channels for both wafer and module device-testing.

These 64 signal-I/Os must include all device-inputs required for test-clocking and control, as well as all scan-data-inputs and scan-data-outputs of the shift-registers. The 64-pin limit constrains most ASIC products to a practical upper-bound of approximately 24 shift-registers per device. Thus, a typical ASIC may have far-fewer, much-longer shift-registers than a microprocessor (or other standard product) of similar logical complexity. As ASICs become earlier adopters of leading-edge technology, their risk of broken-shift-register diagnostic problems is amplified by this difference in device-design style.

SUMMARY OF THE INVENTION

An object of this invention is to improve apparatus and method for diagnosing shift registers Another object of the present invention is to more easily localize the position of a shift-register break.

A further object of this invention is to provide a method and apparatus for diagnosing shift registers that logically emulates the effect of having many more, shorter shift registers, while still maintaining the reduced pin-count interface that is so important to ASIC test economics.

These and other objectives are attained, in accordance with the present invention, by providing a systematic means of switching contiguous segments of each production-test shift-register into several diagnostic scan-configurations. If the functional scan-verification tests fail for the production-test scan-configuration, then these same verification tests can be repeated for the alternative, diagnostic scan configurations. Using the principle of superposition, the passing and failing LSSD flush/scan tests for these diagnostic configurations will allow the failing location to be localized to a single segment of the original failing shift-register.

Further benefits and advantages of the invention will become apparent from a consideration of the following detailed description, given with reference to the accompanying drawings, which specify and show preferred embodiments of the invention

DETAILED DESCRIPTION OF THE PRESENT INVENTION

This invention augments the base production-test scan-configuration, by pairing the original shift-register set (this implies starting with an even-number of shift-registers) and then adding scan-path crossovers between the paired shift-registers at proportional intervals along the bit-lengths of each. The procedure for adding/connecting the required crossover logic is as follows:

1. Pair the shift-registers, beginning with an even-number of shift-registers whose bit-lengths have been fully balanced for scan-testing efficiency.
2. For each pair, insert 2-to-1 multiplexers in each shift-register scan-path at approximately equidistant intervals depending on the number of shift-register segments to be created: _Two segments per shift-register—insert a single multiplexer at the 50% point of each; _Four segments per shift-register—insert three multiplexers at the 25/50/75% points of each; _Eight segments per shift-register—insert seven multiplexers at the 12.5/25/37.5/50/62.5/75/87.5% points of each; _Sixteen segments per shift-registerâ€" insert fifteen multiplexers at the 6/25/12.5/18.75/25/31.25/37.5/43.75/50/56.25/62.3/68.75/75/81.25/87.5/93.25% points of each.

3. The scan-path of the original production-test scan-configuration is connected to the zero-port of each multiplexer, and the one-port is connected to its twin connection in the paired shift-register.

Table 1 summarizes a binary decoding of two scan-mode control inputs (SM0 and SM1) to enable four distinct scan-configurations—thereby permitting each shift-register to be logically subdivided into four equal-length segments by means of inserting three multiplexers in each:

Table 1. 2-to-4 Scan-Mode Decode SM1 (Scan-Mode Bit 1)SM0 (Scan-Mode Bit 0)Decoded Scan-Function00Production-Test Mode 001Diagnostic Mode 110Diagnostic Mode 211 Diagnostic Mode 3

More than one method of shift-register scan-reconfiguration is possible, depending on how the scan-mode bits (SM0 and SM1) are used to manipulate the scan-segment control lines of the added multiplexers.

Figure 1:
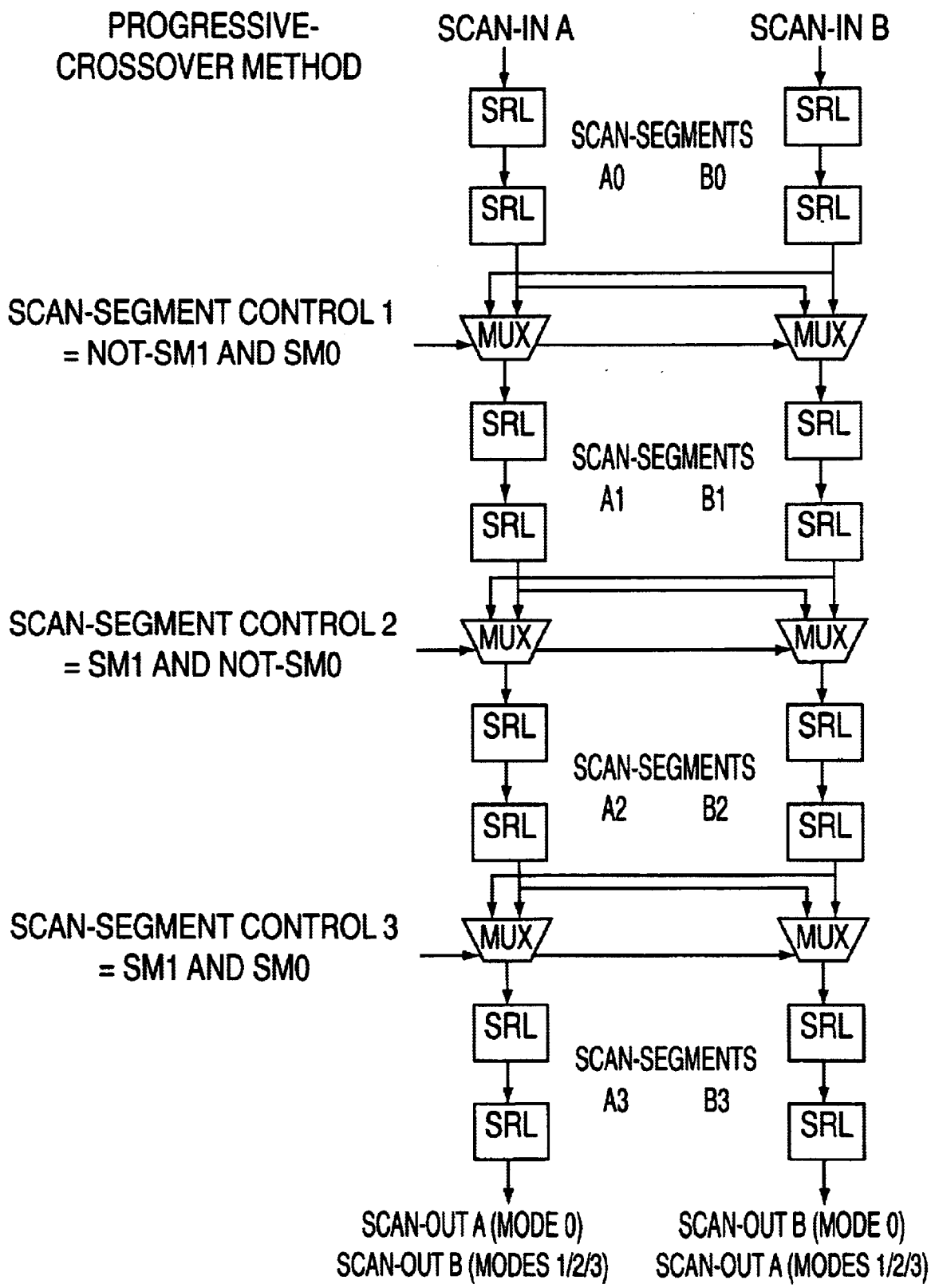
FIG. 1 depicts a method, referred to as the progressive crossover method, for implementing the invention.

FIG. 1 depicts a progressive-crossover method for a pair of shift-registers A and B, wherein all diagnostic modes map the original scan-data-input signal of a particular base-configuration shift-register to the scan-data-output signal of the corresponding paired shift-register. The shift-register configurations for the progressive-crossover method are summarized in Table 2:

Table 2. Progressive-Crossover Shift-Register Configurations Scan-ModeShift-Register AShift-Register BProduction-Test Mode 0Segments: A0-A1-A2-A3Segments: B0-B1-B2-B3Crossover Mode 1Segments: A0-B1-B2-B3Segments: B0-A1-A2-A3Crossover Mode 2Segments: A0-A1-B2-B3Segments: B0-B1-A2-A3Crossover Mode 3Segments: A0-A1-A2-B3Segments: B0-B1-B2-A3

In FIG. 1, the multiplexer scan-segment control lines are directly derived from the diagnostic mode decode of Table 1:

—Scan-Segment Control 1=NOT-SM1 AND SM0 (Diagnostic Mode 1)_Scan-Segment Control 2=SM1 AND NOT–SM0 (Diagnostic Mode 2)_Scan-Segment Control 3=SM1 AND SM0 (Diagnostic Mode 3)

Figure 2:
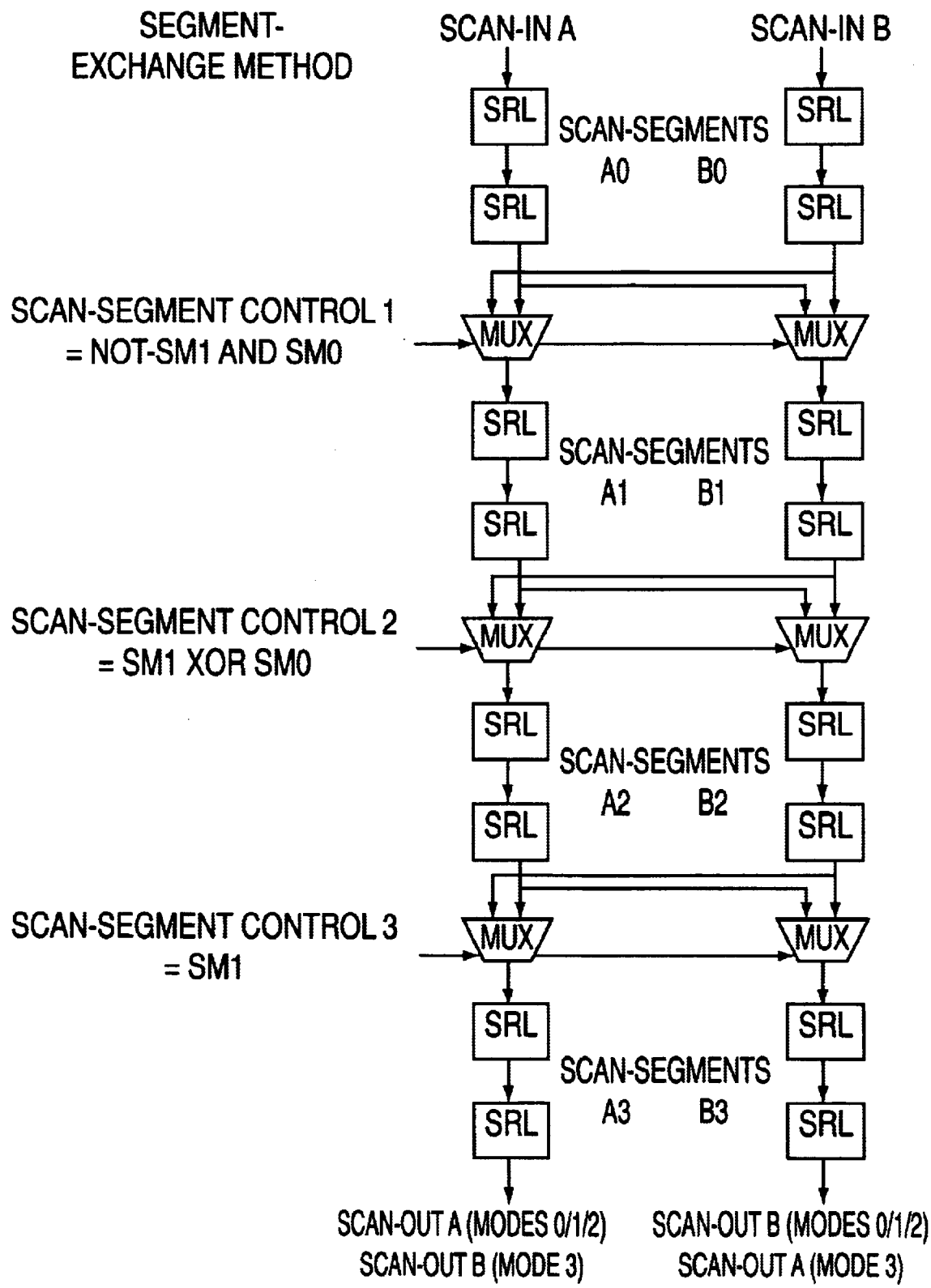
FIG. 2 illustrates an alternate method, referred to as the segment exchange method, for practicing the present invention.

FIG. 2 illustrates an alternative method of shift-register reconfiguration by exchanging a single scan-segment in each shift-register with its paired twin. The shift-register configurations for the segment-exchange method are summarized in Table 3:

Table 3. Segment-Exchange Shift-Register Configurations Scan-ModeShift-Register AShift-Register BProduction-Test Mode 0Segments: A0-A1-A2-A3Segments: B0-B1-B2-B3Exchange Mode 1Segments: A0-B1-A2-A3Segments: B0-A1-B2-B3Exchange Mode 2Segments: A0-A1-B2-A3Segments: B0-B1-A2-B3Exchange Mode 3Segments: A0-A1-A2-B3Segments: B0-B1-B2-A3

In this case, the multiplexer scan-segment control lines are specified as follows: _Scan-Segment control 1=NOT–SM1 AND SM0 (Diagnostic Mode 1)_Scan-Segment Control 2=SM1 XOR SM0_Scan-Segment Control 3=SM1

From an LSSD scan-test perspective, the additional scan-mode control-inputs SM0/SM1 are two additional LSSD scan-gate (SG) input functions. However, if they are simply treated as such, they are constrained to be placed within the fixed 64-full-function test-pin budget previously established as important to ASIC test economics. If used in this manner, they would tend to displace two pins that would otherwise be available for an additional production-test shift-register (which is undesirable from a production-test cost-perspective). Therefore, in some situations, it may be preferred to provide a means to enable the shift-register reconfigurability without added constraints on the 64-full-function pin budget.

Fortunately, newer ASIC product families provide an alternative. These products support an additional budget of up-to-56 restricted-function test pins, also referred to as DC-test pins. Pins now assigned to the DC-test category are currently constrained to be used only for signals that require at most a single, fixed logic-value for any given logic-test mode—and/or for test signals for macro (SRAM, DRAM, PLL, etc.) testing, provided that the fixed number of logic-value transitions required for such macro tests has been determined to be a-priori-compatible with the restricted-function tester resources available for such pins.

In light of the foregoing, with one implementation of this invention, the current definition of DC-test-pin usage can be extended to include diagnostic scan-mode pins (SM0, SM1, â€¦) as defined herein, subject to the following considerations: 1. If these DC-test-input pins are shared for product-functional usage, an appropriate ASIC pin-sharing cell must be used to bound the scope of logic that cannot be tested due to the test-pin usage-constraint for the bulk of logic scan-testing. 2. These pins are to be coded as LSSD Test-inhibit (TI) inputs for the internal logic-test modes and for the added shift-register diagnostic support discussed herein. .If the two preceding conditions have been satisfied, then it should be possible to relax the TI-constraint on the diagnostic scan-mode pins, converting them to SG-inputs during the external logic-test mode—for purposes of cleanup fault-mark-off of the added scan-path multiplexers—without exceeding tester restrictions for DC-test-pin transitions. (If this proves not to be the case, this last step can be eliminated at the expense of omitting explicit testing of some fault-sites associated with the added shift-register configuration logic—which by definition cannot impact device functionality).

The procedure by which this invention is integrated into the testing and diagnostic process may be summarized as follows:

1. Functional verification-testing of the base production-test shift-register configuration is performed as usual, noting any fails that occur during the LSSD flush and scan tests.
2. If any of the flush and scan tests fail, all flush and scan tests are repeated for all defined diagnostic scan-modes, noting all passing and failing results.
3. If only one base production-test shift-register is failing, superposition of the passing and failing scan tests will yield an unambiguous single-scan-segment call-out. If multiple production-test shift-registers fail, but not both of any diagnostic pair—then the multiple fails are independently localizable to a single scan-segment in each case. If both shift-registers of a diagnostic pair fail the production-mode flush and scan tests, it is possible that some additional localizing information can still be deduced from the diagnostic-mode results.
4. Starting from this hardware-assisted localization to a failing shift-register segment, the broken shift-register diagnosis can proceed to conclusion based on binary-search fault-insertion/simulation methods in current use.

In order to fully clarify the meaning of step 3 above, some illustrative examples are provided:

Table 4. Case 1: Example Using the Progressive-Crossover Method (see FIG. 1 and Table 2) Scan-ModeShift-Register A Flush/Scan Test-ResultShift-Register B Flush/Scan Test-ResultFailing Shift-Register Segment-MapProduction Mode 0FailPassM0-SRA: A0-A1-A2-A3Crossover Mode 1PassFailM1-SRB: B0-A1-A2-A3Crossover Mode 2PassFailM2-SRB: B0-B1-A2-A3Crossover Mode 3FailPassM3-SRA: A0-A1-A2-B3

In Case 1, the intersection of the failing shift-register segments for each mode clearly identifies Segment A2 as the one consistent source for all observed fails.

Table 5. Case 2: Example Using the Segment-Exchange Method (see FIG. 2 and Table 3) Scan-ModeShift-Register A Flush/Scan Test-ResultShift-Register B Flush/Scan Test-ResultFailing Shift-Register Segment-MapProduction Mode 0PassFailM0-SRB: B0-B1-B2-B3Crossover Mode 1FailPassM1-SRA: A0-B1-A2-A3Crossover Mode 2PassFailM2-SRB: B0-B1-A2-B3Crossover Mode 3PassFailM3-SRB: B0-B1-B2-A3

In Case 2, the intersection of the failing shift-register segments for each mode clearly identifies Segment B1 as the one consistent source for all observed fails.

Table 6. Case 3: Example Using the Segment-Exchange Method (see FIG. 2 and Table 3) Scan-ModeShift-Register A Flush/Scan Test-ResultShift-Register B Flush/Scan Test-ResultPassing Shift-Register Segment-MapProduction Mode 0FailFailCrossover Mode 1FailPassM1-SRB: B0-A1-B2-B3Crossover Mode 2PassFailM2-SRA: A0-A1-B2-A3Crossover Mode 3FailFail Case 3 depicts an instance of both shift-registers failing in the base production-test configuration. This example illustrates how failing-segment identification is still possible in some instances. In this case, it is significant to note that shift-register B passes in mode 1 and shift-register A passes in mode 2. Under these circumstances, it is easier to find the failing segments by noting which shift-register segments have been proven functional by virtue of passing in at least one mode: A0, A1, A3, B0, B2 and B3. Thus, by process of exclusion it may be deduced that there are defects in shift-register segments B1 and A2.

As stated previously, the problem of broken-shift-register risk-management has been handled for microprocessors (and other standard products) by maximizing the number of shift-registers to minimize their length. This minimizes the number of state-elements whose value is uncertain as a consequence of the broken-shift-register scanning operations.

The apparatus and method disclosed herein bounds the uncertainty about which bit-positions in a broken-shift-register might be responsible for its faulty behavior, thus achieving the same logical localizing effect as having many more, shorter shift-registers—while simultaneously preserving the reduced-pin-count testing interface that is important to ASIC test economics (and that is incompatible with the maximum-number-of-shift-registers approach).

The additional logic elements that may be used to implement this invention are:

1. Scan-path multiplexers to enable multiple shift-register scan-configurations that emulate the effect of many more, shorter shift-registers for broken-shift-register diagnostic purposes: __Emulating 2× the actual number of shift-registers requires one multiplexer per shift-register; __Emulating 4× the actual number of shift-registers requires three multiplexers per shift-register; __Emulating 8× the actual number of shift-registers requires seven multiplexers per shift-register; __Emulating 16× the actual number of shift-registers requires fifteen multiplexers per shift-register.

2. DC-test-pin input controls for the required diagnostic scan-modes, including functional pin-sharing logic (as appropriate), and any necessary scan-segment control-decode logic (with buffer-repowering as needed): __Two scan-modes requires one scan-mode pin; __Four scan-modes requires two scan-mode pins; __Eight scan-modes requires three scan-mode pins; __Sixteen scan-modes requires four scan-mode pins.

The cost of implementing the 4× support should be negligible for almost any ASIC chip design. The 8×/16× implementations may be considered to be a reasonable diagnostic investment even for today's bigger chips, and certainly will be more attractive as chip-sizes continue to scale-up in the future.

Although the preceding description of this invention has addressed only the pairing of shift-registers as the simplest and preferred embodiment, the apparatus and method herein disclosed may also be utilized in a manner using any ordered integer grouping of shift-registers. That is, if the device design were to include 24 total shift-registers, these techniques apply not only to 12 pairs of shift-registers, but equally to 8 groups of 3, 6 groups of 4, 4 groups of 6, 3 groups of 8, or even one group of 24.

If each shift-register grouping is ordered (either alphabetically or numerically), then the generalized modification of the progressive-crossover method as previously described is for each shift-register in the group to exchange crossover points with the next highest-order member exchanges with the lowest-order member of the group. The generalization of the segment-exchange method as previously described may be accomplished.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method for hardware assisted diagnosis of faulty logic-test shift registers, the method comprising:

separating each of the shift registers into a plurality of segments;

providing a systematic means of connecting together segments of the test shift registers into several different diagnostic scan configurations; and applying signals to the different scan configurations to help identify faulty segments of the registers.

2. A method according to claim 1, wherein the providing step includes the steps of:

pairing together shift registers; and adding scan-path crossovers between the paired shift registers at intervals along the bit length of each shift register to facilitate localizing faults in the shift registers.

3. A method according to claim 2, wherein the adding step includes the step of separating the paired shift registers into corresponding segments.

4. A method according to claim 3, wherein, in each pair of shift registers, the scan path crossovers are used to substitute individual segments of one of the pair of shift registers for individual corresponding segments of the other of the pair of shift registers.

5. A method for diagnosing shift registers, comprising:

pairing together shift registers;

separating each of the paired shift registers into a plurality of segments;

adding scan-path crossovers between the paired shift registers at intervals along the bit length of each shift register; and for each pair of shift registers, using the scan-path crossovers to map output signals from segments of one of the pair of shift registers to segments of the other of the pair of shift registers to localize faults in the shift registers.

6. A method according to claim 5, wherein the using step includes the step of mapping output signals of progressive segments of one of the pair of shift registers to the other of the pair of shift registers.

7. A method according to claim 5, wherein the using step includes the step of using the crossover paths to substitute individual segments of one of the pair of shift registers for individual corresponding segments of the other of the pair of shift registers.

8. A method according to claim 5, wherein the adding step includes the step of using a set of multiplexers to separate each shift register into a plurality of segments, and mapping an output of one of the multiplexers to a multiplexer of a paired shift register.

9. Apparatus for hardware assisted diagnosis of broken logic-test shift registers, comprising:

means separating each of the shift registers into a plurality of segments;

a system for connecting together segments of the test shift registers into several different diagnostic scan configurations; and means for applying signals to the different scan configurations to help identify faulty segments of the registers.

10. Apparatus according to claim 9, wherein said system includes:

at least one scan-path crossover between the pair of shift registers, at an interval along the bit length of each shift register, to facilitate localizing faults in the shift registers.

11. Apparatus according to claim 10, wherein the scan path crossovers separate each of the shift registers into a segments.

12. Apparatus according to claim 10, wherein said system further includes means for mapping output signals of progressive segments of one of the shift registers to the other of the shift registers.

13. Apparatus according to claim 10, wherein said system further includes means for using the crossover paths to substitute individual segments of one of the pair of shift registers for individual corresponding segments of the shift registers.

14. Apparatus according to claim 10, wherein the crossover pats include a set of multiplexers separating each of the shift registers into a plurality of segments.

15. Apparatus according to claim 14, wherein each multiplexer is connected to both of the shift registers for mapping signals from one of the shift registers to the other of the shift registers.

16. A method for hardware assisted diagnosis of faulty logic-test shift registers, the method comprising:

providing a systematic means of switching contiguous segments of each test shift register into several different diagnostic scan configurations, including the steps of pairing together shift registers, adding scan-path crossovers between the paired shift registers at intervals along each shift register to facilitate localizing faults in the shift registers, and wherein the scan-path crossovers form progressive crossover paths for mapping output signals of progressive segments of one of the pair of shift registers to the other of the pair of shift registers.

* * * * *